United States Patent
Kapur et al.

(10) Patent No.: US 7,721,233 B2
(45) Date of Patent: May 18, 2010

(54) EFFICIENT LARGE-SCALE FULL-WAVE SIMULATION

(76) Inventors: Sharad Kapur, 86 Clinton St., Unit 2, Hoboken, NJ (US) 07030; David E. Long, 63 Fairview Ave., New Providence, NJ (US) 07974

( * ) Notice: Subject to any disclaimer, the term of this patent is extended or adjusted under 35 U.S.C. 154(b) by 419 days.

(21) Appl. No.: 11/231,122

(22) Filed: Sep. 20, 2005

(65) Prior Publication Data

US 2006/0080623 A1 Apr. 13, 2006

Related U.S. Application Data

(63) Continuation-in-part of application No. 10/960,554, filed on Oct. 7, 2004, now abandoned.

(51) Int. Cl.
G06F 17/50 (2006.01)
(52) U.S. Cl. .......................................................... 716/4
(58) Field of Classification Search .................. 716/20, 716/4
See application file for complete search history.

(56) References Cited

U.S. PATENT DOCUMENTS

| | | | | |
|---|---|---|---|---|
| 6,051,027 A * | 4/2000 | Kapur et al. | ..................... | 703/5 |
| 6,064,808 A * | 5/2000 | Kapur et al. | ..................... | 703/2 |
| 6,314,545 B1 * | 11/2001 | Kapur et al. | ..................... | 716/5 |
| 6,513,001 B1 * | 1/2003 | Kapur et al. | ..................... | 703/13 |
| 6,606,586 B1 * | 8/2003 | Ishikawa | ..................... | 703/5 |
| 6,871,167 B1 * | 3/2005 | Kapur et al. | ..................... | 703/2 |
| 2002/0123872 A1 * | 9/2002 | Okada | ..................... | 703/15 |
| 2004/0024576 A1 * | 2/2004 | Meuris et al. | ..................... | 703/6 |
| 2004/0194051 A1 * | 9/2004 | Croft | ..................... | 716/20 |

OTHER PUBLICATIONS

Kapur et al.; "Large-Scale Full-Wave Simulation"; Jun. 11, 2004; ACM; All pages.*
Zhao et al.; "Efficient Three-Dimensional Extraction Based on Static and Full-Wave Layered Green's Functions"; 1998; ACM; All pages.*
J.R. Mosig, "Integral Equation Technique", Numerical Techniques for Microwave and Millimeter-Wave Passive Structures, T. Itoh, editor, pp. 133-213, Wiley, 1989.
S.M. Rao, D.R. Wilton, and A.W. Glisson, "Electromagnetic Scattering by Surfaces of Arbitrary Shape," IEEE Trans. on Antennas and Propagation, AP-30:409-418, May 1982.

(Continued)

*Primary Examiner*—Sun J Lin
*Assistant Examiner*—Suresh Memula
(74) *Attorney, Agent, or Firm*—Henry Brendzel

(57) ABSTRACT

Significant improvement is achieved in the analysis of IC layout by utilizing the fact that IC designs exhibit a large amount of regularity. By employing a unique mesh generation approach that takes advantage of the regularity, combined with the use of a limited number of different shapes for the majority of the IC geometry greatly increases the speed of processing. Additionally, by employing a unique approach for specifying the different mesh elements—based on the parameters that define the relative difference between one shape and another—provides significant additional reductions in the necessary calculations, and a corresponding increase in speed of IC simulations. Yet another improvement is realized by simplifying the inductive influence calculations by employing averages that permit using dot products of vectors rather than integrations of non-constant vectors.

10 Claims, 3 Drawing Sheets

OTHER PUBLICATIONS

S.Kapur, D.E. Long, Large-Scale Full Wave Simulation, DAC, 2004, Jun. 7-11, 2004, San Diego.

S. Uckum, T. K. Karkar, S. M. Rao, M. Salazar-Palma, "A Novel Technique for Analysis of Electromagnetic Scattering from Microstrip Antennas of Arbitrary Shape", IEEE Transactions on Microwave Theory and Techniques, vol. 45, No. 4, Apr. 1997.

* cited by examiner

A MATRIX (VALUES) → UNIQUE VALUES ← A MATRIX (POINTERS)

A MATRIX (VALUES) → CACHE ← A MATRIX (POINTERS & VALUES)

FIG. 8    TYPE:OFFSET:ROTATION

US 7,721,233 B2

EFFICIENT LARGE-SCALE FULL-WAVE SIMULATION

RELATED APPLICATION

This is a continuation in part of U.S. patent application Ser. No. 10/960,554, filed Oct. 7, 2004, now abandoned which is hereby incorporated by reference.

BACKGROUND

This invention pertains to integrated circuit (IC) simulations, and more particularly to methods for accurately simulating the behavior of integrated circuits.

Current day integrated circuits often contain millions of electronic elements within a single chip. The internal structures of these electronic elements are in the sub-micron range, and some of these ICs operate at very high frequencies. Consequently, accurate simulations of the IC designs are essential.

Some tools already exist in the computer aided design (CAD) community for digital extraction and simulation of ICs, and these tools are being adapted for high-speed design. However, these tools often incorrectly model the physical effects, and the accuracy of their results is deficient to the point that they cannot be used for practical designs. This is illustrated in FIG. 1, where IC layout information is provided to computer 1 wherein a computer aided design (CAD) simulation software 2 interacts with software 3 that models the behavior of the IC elements specified in the layout, and results of the simulation are outputted. The method executed in the FIG. 1 prior art system is shown in FIG. 2. Tools also exist in the microwave community, and these tools are reasonably accurate because they account for both the first-order and second order effects (e.g., interaction of components that are not physically connected to each other) using Maxwell equation formulations.

Basically, the way these tools tackle the problem is by subdividing a given structure of conductive materials into a mesh of interconnected, elemental, three-dimensional shapes that are small enough to precisely subsume the given structure and to yield accurate calculations relative to their interactions. FIG. 4 illustrates multi-layer arrangement of conducting elements that includes a coil 12 at the lower layer, and a collection of leads 11 at the upper layer. With a subdivision of the structure into a collection of elemental pyramids structures such as shown, for example, in a portion of FIG. 4, a solution is obtained by use of numerical methods and precise mathematical representation of the interaction between each of the elemental three-dimensional shapes and all other of the elemental three-dimensional shapes.

The notion of subdividing the given structure into a mesh of elemental three-dimensional shapes and then performing calculations pertaining to those shapes is not unlike the concept used in teaching the principles of integration by, for example, illustrating that when a two-dimensional figure like a circle is divided into small elemental geometric shapes (e.g., squares), the sum of the areas of the small elemental geometric shapes approximates the area of the circle, and that the approximation improves as the size of the small elemental geometric shapes is reduced.

While in mathematical integration the elemental geometric shape when dealing in three dimensions is a cube (dx, dy, dz) that diminishes to infinitesimal size, in FIG. 5 the small elemental geometric shape is a pyramid that is more than infinitesimal in size, albeit, significantly smaller that than the smallest discernable element in the IC's layout. Also unlike the mathematical approach of integration, the simulation art employs elemental shapes (such as the pyramids of FIG. 4) of different sizes and perhaps even of different shapes, so as to create an accurate representation of the physical structure and yet not use an inordinately large number of pyramids. This is possible to achieve because all dimensions in an integrated circuit layout are discrete. Still, the existing tools are extremely slow, and their memory requirements are excessive.

SUMMARY

Deficiencies of prior art methods are overcome, and a significant improvement is achieved by utilizing the fact that IC designs exhibit a large amount of regularity. By additionally employing a unique mesh generation approach that takes advantage of this regularity, combined with the use of a limited number of different shapes for the majority of the IC geometry greatly increased speed of processing is achieved because it reduces and simplifies the necessary calculations. The method disclosed herein that overcomes the deficiencies of prior are methods is generally described in FIG. 3.

Moreover, by employing a unique approach for specifying the different mesh elements—based on the parameters that define the relative difference between one shape and another—provides significant additional reductions in the necessary calculations, and a corresponding increase in speed of IC simulations. Yet another improvement is realized by simplifying the inductive influence calculations by employing averages that permit using dot products of vectors rather than integrations of non-constant vectors.

BRIEF DESCRIPTION OF THE DRAWING

FIG. 8 depicts a tuple that specifies an element.

DETAILED DESCRIPTION

Figure 1:
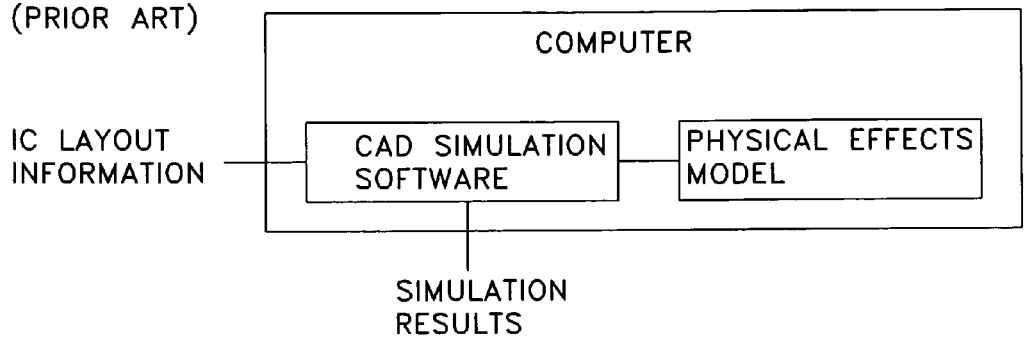
FIG. 1 shows prior art structure for performing IC simulations.
Figure 2:
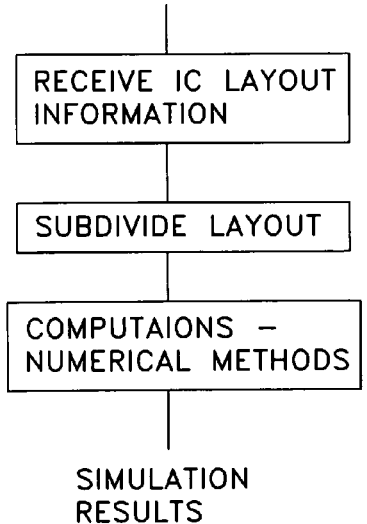
FIG. 2 shows the process of the FIG. 1 system.
Figure 3:
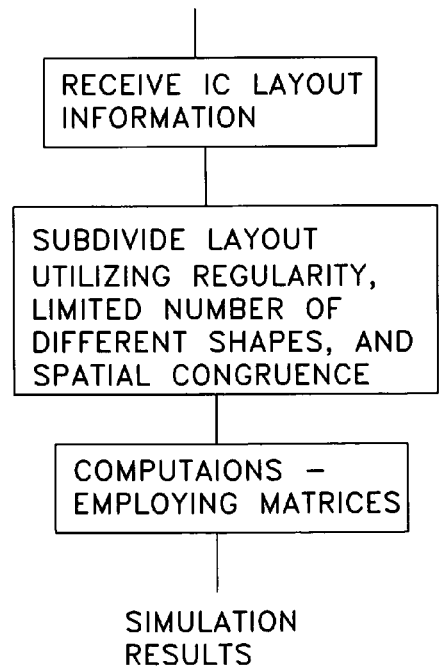
FIG. 3 shows the improved process disclosed herein.
Figure 4:
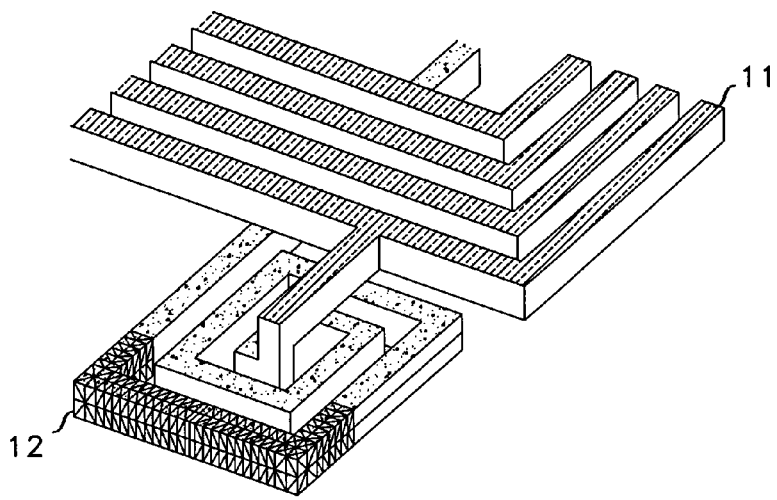
FIG. 4 shows a three-dimensional view of a multi-layer section of an IC that is subdivided into a large number of elemental shapes.

As discussed above, a standard formulation of the simulation problem when dealing with very high frequencies and very tightly packed components is based on Maxwell's equations. In the frequency domain, the stimulus electric field E is expressed by:

$$E = \frac{1}{\sigma}J(r) + j\omega A(r) + \nabla \phi(r) \qquad (1)$$

where $A(r) = \int G_A(r,r')J(r')dr'$, $\phi(r) = \int G_\phi(r,r')\rho(r')dr'$, J is the current density,
ρ is the charge density,
$G_A$ is the vector potential Green's function,
$G_\phi$ is the scalar potential Green's function, and
r and r' are displacement vectors.

The vector and scalar potentials are obtained by integrating over the conductive material. Analytic expressions for Green's functions do not exist in a layered medium, so a classical approaches for constructing Green's function tables via numerical Hankel transforms is used, for example, as taught by J. R. Mosig, "Integral equation technique," *Numerical Techniques for Microwave and Millimeter-Wave Passive Structures*, T. Itoh, editor, pages 133-213. Wiley, 1989.

For a numerical solution of the equations, the structure to be simulated is converted into a plurality of discrete mesh elements, typically of triangular and rectangular shape (or prisms and rectangular parallipipeds in 3 dimensions), and a Galerkin scheme is applied as taught, for example, by J. J. H. Wang, "Generalized Moment Methods," *Electromagnetics*, Wiley, 1991. Basis functions are employed, which are composed of linear Rao-Wilton-Glisson basis functions (sometimes referred to as rooftop functions) defined on the mesh elements, as taught, for example, in S. M. Rao, D. R. Wilton, and A. W. Glisson. "Electromagnetic scattering by surfaces of arbitrary shape," *IEEE Trans. on Antennas and Propagation*, AP-30:409-418, May 1982.

Each mesh element supports a number of elemental currents and/or elemental charges. The number of elemental currents is larger than the number of elemental charges, since different elemental currents represent different possible directions of flow, while elemental charges do not have an associated direction. That is, current is a vector quantity, and charge is a scalar quantity. In the 3-dimensional case, the elemental currents are flows through the different surfaces of volumetric mesh elements, and the elemental charges correspond to surface mesh elements that coincide with the boundaries of the conductors. Generally speaking, this teaching employs the following terminology: the mesh consists of a number of mesh elements, which are represented as tuples that in our preferred embodiment containing shape, displacement vector, and rotation angle information, as described below. A shape refers to a geometric figure (a volume, or a surface) centered at the origin. As part of the mesh, the shape is translated to one or more points and rotated through various angles. The mesh element can have a number of elemental currents and charges associated with it. The shapes may be conceptually divided into regular and irregular shapes. The regular shapes make up the largest part of the mesh and are generally repeated many times. The irregular shapes fill in the gaps and are generally not repeated or are repeated only a few times.

To avoid ill-conditioning at low frequencies, one can adopt a set of basis functions that decompose the current density into curl-free and divergence-free parts as taught, for example, by D. R. Wilton and A. W. Glisson, "On improving the stability of the electric field integral equation at low frequency," *Proc. IEEE Antennas and Propagation Soc. National Symp.*, pages 124-133, 1981. This yields a matrix formulation for equation (1) in the form of:

$$(V^T \Omega V + j\omega V^T A V + S^T \Phi S) X = B, \quad (2)$$

where B is a b×1 vector of driving potentials,
b is the number of basis functions,
Ω is an r×r matrix of the Ohmic interactions among the individual elemental shapes,
r is the number of elemental currents,
A is an r×r matrix describing the inductive interactions among the different elemental currents,
Φ is a t×t matrix that describes the capacitive interactions between the elemental charges,
t is the number of elemental charges,
X is a b×1 vector of unknown basis function coefficients,
V is an r×b matrix that transforms the basis function coefficients into coefficients for the individual elemental currents, and
S is a t×b matrix that transforms the basis function coefficients into coefficients for the individual elemental charges.

The Ohmic interaction between distinct elemental currents is identically zero unless they are the same mesh element. As a result, the Ω matrix is sparse.

In contradistinction, matrix A is dense because each elemental current creates a vector potential throughout all of space, and hence influences all other elemental currents. Similarly, matrix Φ dense because each elemental charge creates a scalar potential throughout the surface, and hence influences all other elemental charges. Since the number of elemental currents is larger than the number of elemental charges, the A matrix is larger than the Φ matrix.

As indicated above, executing a numerical solution of equation (2) for a given IC layout is well known in the art, and the method for arriving at such a solution, per se, is not the subject of this invention. For sake of completeness, it may be mentioned that one such method is the Krylov-subspace iterative solver, taught by R. Barrett et al, in "Templates for the Solution of Linear Systems," *SIAM*, 1994, combined with a kernel-independent Fast Multipole Method (FMM), as taught by us in S. Kapur, D. E. Long, "Large-scale capacitance calculation," *Proc.* $37^{th}$ *Design Automation Conf.*, pages 744-749, June 2000. Another such method is described in S. Kapur, D. E. Long, and J. Zhao, "Efficient full-wave simulation in layered, lossy media," *Proc. Custom Integrated Circuits Conf.*, pages 211-214, May 1998. Yet another such method is described in J. R. Phillips and J. White, "A Precorrected-FFT method for capacitance extraction of complicated 3-D structures," *Proc. 1994 Int. Conf on CAD*, pages 268-271, November 1994.

The problem with the prior art methods is that they are very slow in simulating ICs of current-day size, because calculating the values for the matrices and the products of matrices is time consuming. The fact that the matrices are very large (if good accuracy is desired) greatly compound the problem and result in an unacceptable overall solution time. The principles disclosed herein provide significant improvements in processing speed and in storage requirements, thereby overcoming the deficiencies of the prior art methods.

Figure 5:
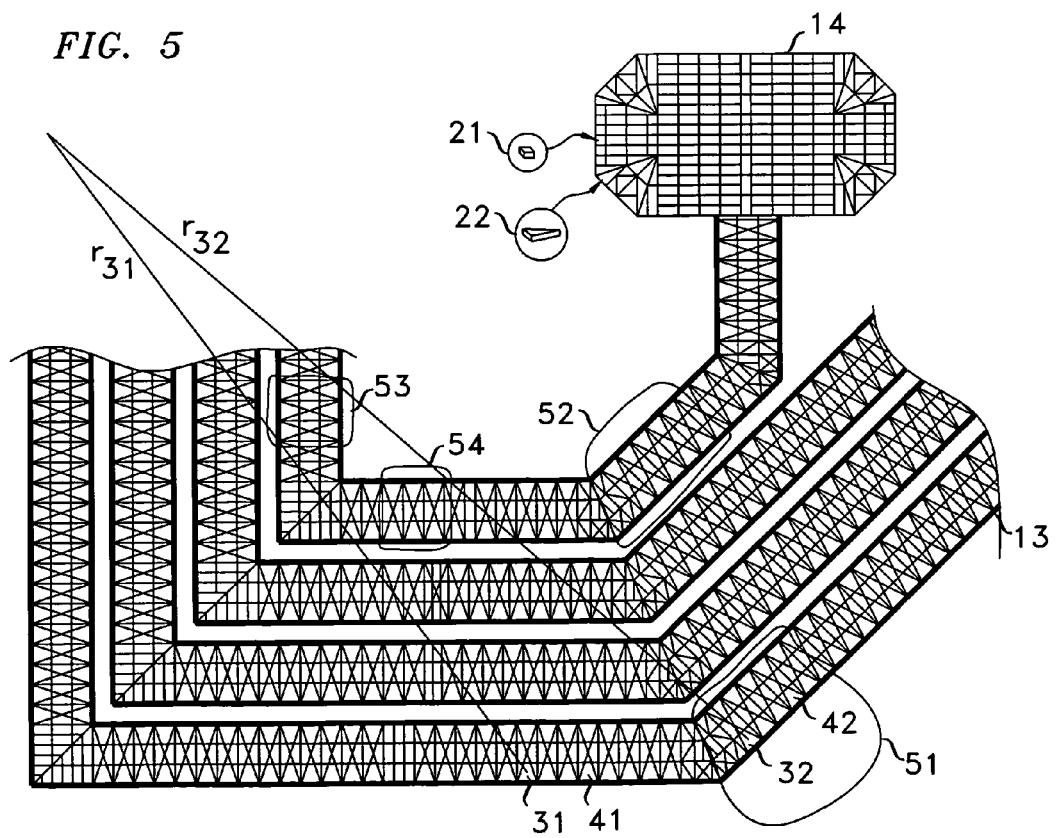
FIG. 5 presents a top view of an illustrative segment of an IC routing and a connection pad.

FIG. 5 presents a top view of an illustrative routing of paths in a typical integrated circuit, from which a number of typical IC layout characteristics can be observed. These are:
routing paths (e.g., path 13) are often uniform in width,
routing paths often run parallel to other routing paths,
routing paths run at 0°, ±45° and ±90°, relative to a chosen direction, and
many components comprise symmetric shapes (e.g., path 13 and pad 14 in FIG. 5).

From these observations we realized that with a proper approach to creating the mesh elements whatever mesh elements are created for one routing path could be repeated to a fairly large extent in another routing path. This results in a natural repetition of the elemental currents flowing through, and charges that accumulate on these mesh elements. Moreover, we realized that in the context of simulating the effects of one elemental current or charge on another, it is the relative position of the supporting mesh elements that determines the resulting effect.

Based on these realizations, in accord with one of principles disclosed herein, the decomposition of the IC's layout is performed with an eye toward increasing regularity. Specifically, we select a set of oft-repeated mesh elements (shapes)—regular elements—that is small in number and that, in combination, can be used to subdivide almost all of the conductor volumes and surfaces found in the IC. Other mesh elements—irregular elements—are used to fill in remaining parts of the volumes, but the number of occurrences of those other elements is relatively small.

There is no way in general to quantify the total number of the regular elements that are used in the analysis of a particular circuit, but what really matters is that the vast majority of interactions are duplicates of things that have already been computed. With methods like the FMM, the only interactions that must be explicitly computed are of elements to nearby elements. Consequently, if one has occasional isolated irregular elements, one has to do a small amount of work around each such irregular element, and for the large areas covered by regular elements one can dispense with burdensome computations because the elements usually have the same relative positions as in other areas.

Because integrated circuit paths are composed of sections, and adjacent sections are stitched to each other at an angle that is a multiple of 45°, it is advantageous to first subdivide the IC layout into such discrete sections, and then subdivide each section using the preselected mesh elements. This is illustrated in FIG. 5 which, in addition to showing the top view of paths and a pad in a typical integrated circuit, shows (in blown-up views) illustrative shapes of three dimensional elements that are employed to effectively build up the paths and the pad. The depicted volumetric shapes are the rectangular parallelopiped (element 21), and the prism (element 22) but other shapes, such as the pyramid, can also be used. The depicted surface shares are rectangle and triangle.

The precise method for subdividing each section is a design choice. It is advantageous, however, to employ a consistent approach because that yields the most repetitiveness. For example, one can choose to start subdividing each segment of an integrated circuit (e.g., a wire, or a pad) from the center of such segment, or from the edge that is stitched to a segment that has been subdivided already, or from the edge that is closest to the origin of a preselected coordinate system. Any of these techniques can be used to create a set of mesh elements. The result of such subdividing in a consistent manner can be seen in FIG. 5 where, for example, the elements encompassed by region 51 have the same interrelationships as the elements encompassed by region 52. In fact, the two regions may be made congruent through simple linear translation. Similarly, regions 53 and 54 can be made congruent through simple rotation and linear translation. We call this T-R (Translation and Rotation) congruence.

In short, in accord with the principles disclosed herein, a relatively small number of regular elements are used for the vast majority of the layout, and a method for subdividing an IC layout is used with a focus toward increasing instances where T-R congruence exists between pairs of mesh elements.

Additionally, with an eye toward not only having many instances of T-R congruence but also easily identifying such congruence, in accord with another aspect of the method disclosed herein, the mesh elements are specified in terms that offer convenient focus on the relative relationships. Illustratively, the specification schema the we employ specifies each mesh element with a tuple s,r,α (FIG. 8), where s stands for a pointer to a table that contains the set of unique shapes, r stands for the position relative to an origin, and a stands for the number of degrees of rotation (counterclockwise) relative to the α axis. A shape refers to a geometric figure of definite size centered at the origin. For a mesh element, the shape is translated to a particular position with the displacement vector r and rotated through the angle α. Mesh elements that differ only by rotation and/or translation share the same shape s. It is clear that the interaction between elemental currents or charges supported by elements 31 and 32 is a function of the shapes, of the relative displacements, and of the relative rotations. More precisely, we may systematically choose one element, say 31, and consider the position of element 32 relative to element 31. The lateral displacement between the elements is $r_{32}-r_{31}$, and the rotational displacement is $-\alpha_{32}$ (because if we rotate element 32 through the angle $-\alpha_{32}$ then the displaced element 32 would become congruent with element 31. Further, we see that the relative displacements and relative rotations of elements 41 and 42 is the same as for 31 and 32 and, therefore, there is also T-R congruence between the pairs of elements 31, 32 and 41, 42. In short, with the above-chosen mode of element specifications, easy and quick identification of T-R congruency situations is possible, permitting a quick decision as to interactions whose values need not be computed because they are identical to ones that had been computed previously.

A direct consequence of the subdividing process disclosed above is that a very large number of values in both the A and Φ matrices of a simulated IC are the same. A direct consequence of the above-disclosed method of specifying mesh elements is a quick and simple identification of those mesh elements that will have the same values. Both of these consequences result in a significantly improved performance in solving equation (2).

In particular, in accord with one preferred embodiment, when computing entries in the A and Φ matrices, we maintain a table keyed by a pair of shapes, a relative displacement between the shapes, and a relative rotation. Because mesh elements are stored as tuples s,r,α it is easy to easy to determine whether the entry corresponding to the interaction between mesh elements $s_1,r_1,\alpha_1$ and $s_2,r_2,\alpha_2$ is the same as some other previously computed interaction. As basically noted above, one translates the origin of $s_2$ to coincide with $s_1$ by subtracting $r_1$ from both relative positions to obtain $s_1,0,\alpha_1$ and $s_2(r_2-r_1),\alpha_2$. Rotations by $-\alpha_1$ to yield $s_1,0,0$ and $s_2$,rot$(r_2-r_1,-\alpha_1),(\alpha_2-\alpha_1)$, respectively, and thus the only variable quantities are $s_1$, $s_2$, the vector $(r_2-r_1)$ rotated by $-\alpha_1$, and $(\alpha_2-\alpha_1)$. One can then search a table for entry $s_1,s_2$,rot$(r_2-r_1,-\alpha_1),(\alpha_2-\alpha_1)$. If the entry exists, the interaction has already been computed. If not, then the interaction is evaluated and stored in the table for later use. Computing the index for the table entry and checking the table is a very simple operation and is much faster than computing the interaction.

Using algorithms such as the FMM or Precorrected-FFT, as cited earlier, the only interactions that need to be computed explicitly are those between elemental currents or elemental charges that are near to each other (that is, elements that are separated by at most a selected number of few mesh elements). This increases the effectiveness of using regular mesh elements and a table of previously computed interactions, since the number of distinct relative displacement vectors is reduced.

Figure 6:
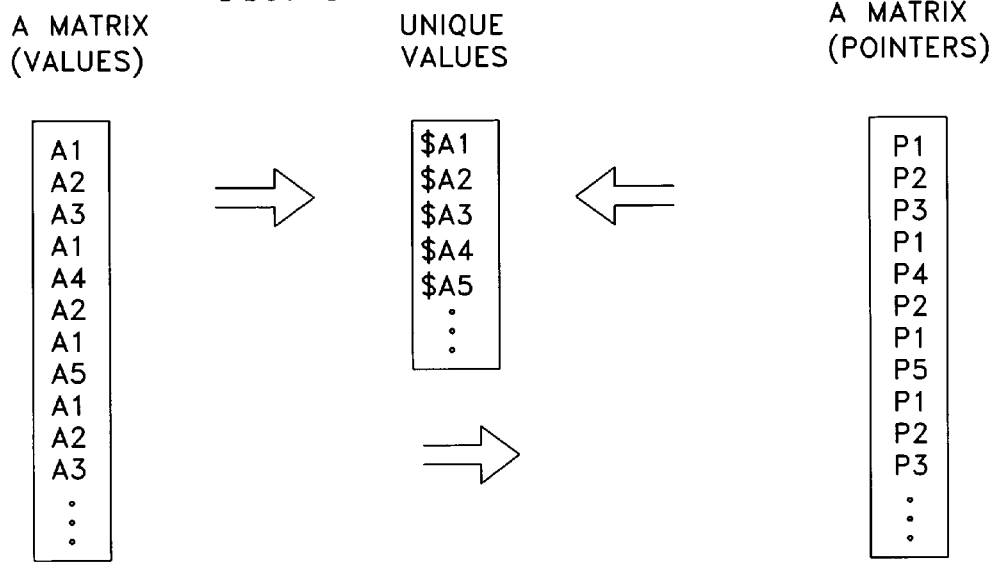
FIG. 6 depicts one approach for storing values for large matrices of the type obtained in accord with the principles disclosed herein.

The fact that the A and Φ matrices comprise many coefficients that have the same values offers an opportunity to employ compression techniques to greatly reduce the storage requirements in an actual implementation of the equation (2)

solution. In accordance with one approach, for example, each unique interaction value is stored in a table. The table is small compared to the number of matrix entries, and a matrix can be represented by a sequence of indices into the table. To illustrate, FIG. 6 shows the first 11 entries of, for example, the A matrix in the left table. Each computed value that is unique is stored in the unique values table (in the center of the figure) which, for the illustrative sequence of 11 entries, consists of the values (designated by the $ sign) of the A1, A2, A3, A4, and A5 interactions. The matrix that is therefore stored is one of pointers, as shown in the right table of FIG. 6. Since the number of unique values is relatively small, the number of bits that are needed in order to specify a pointer is much smaller than the number of bits that are necessary to specify the values and, thereby, a saving of memory is attained.

Figure 7:
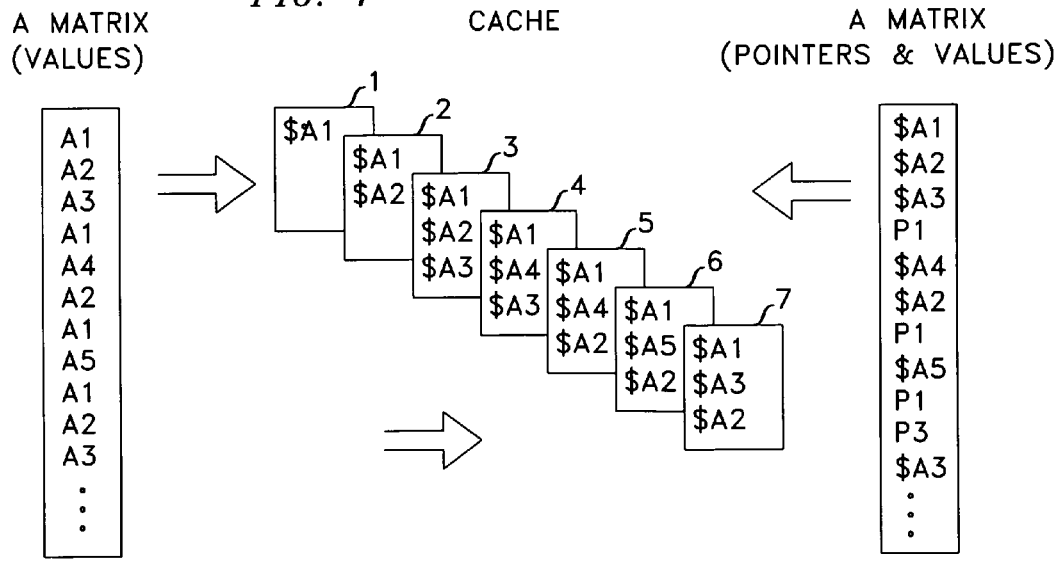
FIG. 7 depicts another approach for storing values for large matrices of the type obtained in accord with the principles disclosed herein.

Another approach that can be used is illustrated in FIG. 7, where instead of using a table of all unique interaction values, which still can be quite extensive, a smaller cache memory is used. Illustratively in FIG. 7, the cache contains only 3 values. The arrangement operates as follows. The first element interaction of the matrix is A1 and, obviously, that value needs is not in the cache. As a result, the actual value must be stored in the A matrix representation. The value is then placed in the cache ($A1), as shown by cache image 1. By a similar procedure, entries $A2 and $A3 are inserted into the cache (cache images 2 and 3, respectively). When the $4^{th}$ entry of the A matrix needs to be specified, it is noted that this entry is A1, which (a) is the same as the $1^{st}$ entry of the matrix and (b) the value of A1 is found in the cache. Consequently, no changes are made in the cache and an entry is made in the pointers table, pointing to $A1 in the cache, i.e., to the first location of the cache. Since the value was found in the cache, no actual value is stored for the $4^{th}$ entry of the matrix; only a pointer is required.

When the $5^{th}$ entry of the A matrix needs to be specified, it is noted that this entry is A4 and that there is no entry in the cache that provides the value of A4 ($A4). Consequently, the value of A4 must be stored, and the stored values is placed in the cache. Since the cache is full, some other value needs to be discarded, and this can be done in accord with any conventional technique for updating cache memories. If, for example, the most-back-in-time-used notion is employed, it is noted that A2 is the most back-in-time-used entry, so the value $A2 in the second location of the cache is replaced with the value $A4 (cache image 4). When the $6^{th}$ entry of the A matrix needs to be evaluated, the $A3 value in the cache is replaced with $A2 (cache image 5), and note that the $A2 value is stored anew, even though it had been stored previously, because it is no longer in the cache. This, effectively, is the penalty for using a fixed length cache, as compared to the unique values table of FIG. 6.

Employing the same approach, the $7^{th}$ entry (A1) does not cause a change in the cache, the $8^{th}$ entry (A5) causes the $A4 value to be replaced with the $A value in the cache (cache image 6), the $9^{th}$ entry (A1) and the $10^{th}$ entry (A2) do not cause a change in the cache, and the last-illustrated entry (A3) causes the $A5 value to be replaced by the $A3 value (cache image 7).

In viewing the calculations involved in obtaining the values for the inductive interactions, it is noted that not only is the A matrix large, but since it defines the inductive interactions among elemental currents, those interactions are computed using integrals involving vector quantities. This is because the elemental currents are vectors (having magnitude and direction). In contradistinction, the $\Phi$ matrix defines the capacitive interactions among elemental charges, and those charges are scalar quantities. Hence, the computations involving matrix A represent a more significant challenge than the computations involving $\Phi$ matrix.

When computing the value of a coefficient in matrix A, the following double integral is involved, with the variability of the current within the mesh being within the integral signs:

$$\int_{e_1}\int_{e_2} G_A(r_1, r_2)(c_1(r_1) \cdot c_2(r_2)) dr_1\, dr_2.$$

Here $c_1(r_1)$ is an elemental current function supported by mesh element $e_1$, and $c_2(r_2)$ is an elemental current function supported by $e_2$. The calculation is especially time consuming because $c_1(r_1)$ and $c_2(r_2)$ are vectors that vary over the domain of integration. However, by approximating the variable current within the element by an average current at the center of the element—turning the variable current into a constant current—allows one to place the current variable outside the integral sign, yielding $$(c_1(\tilde{r}_1) \cdot c_2(\tilde{r}_2)) \int_{e_1}\int_{e_2} G_A(r_1, r_2) dr_1\, dr_2,$$

where $\tilde{r}_1$ and $\tilde{r}_2$ are the centers of the mesh elements, $c_1(\tilde{r}_1)$ is the average current in mesh element $e_1$, and $c_2(\tilde{r}_2)$ is the average current in mesh element $e_2$. This, or course, simplifies the computations, and we found that this simplification does not result in undue erroneous results. The reason why this approximation is accurate rests the following. The matrix A represents the inductive interactions among elemental currents. When using a decomposition of the current density into curl-free and divergence-free parts as taught by Wilton and Glisson, the dominant inductive effects correspond to the divergence-free basis functions. This is because the divergence-free parts correspond to loops of current, such as those occurring within inductors. The curl-free parts are more significant within capacitors, where the inductive effects are small and parasitic. When using basis functions, as taught by Rao, Wilton, and Glisson, each divergence-free basis function has a constant current within each mesh element. In this case, taking the average values of $c_1(r_1)$ and $c_2(r_2)$ and moving them outside the integral involves no error at all. As a result, there is no approximation error in the A matrix for the dominant inductive effects. For the parasitic inductive effects corresponding to curl-free basis functions, there is some approximation error, but the parasitic effects are small.

As a direct consequence of this approximation, the space required for storing the A matrix may be further reduced by factoring out the dot products $(c_1(\tilde{r}_1) \cdot c_2(\tilde{r}_2))$. Then the only matrix that must be stored is the smaller matrix whose entries have the form $$\int_{e_1}\int_{e_2} G_A(r_1, r_2) dr_1\, dr_2.$$

Lastly, multiplication of a vector by the matrix A, which is required for solving the equation (2), can then be done with the following algorithm for computing $V^T AVv$:

w←Vv
for each shape i, initialize $s_i$ to the vector (0,0,0)
for each basis function i with coefficient $w_i$
Let j be the index of the shape for basis function i let $\rho_c$ be basis function i evaluated at shape j's centroid $s_j \leftarrow s_j + w_i r_c$ define matrix $A_s$ by $$A_s(i, j) = \int_i \int_j G_A,$$

where the integrals are scalar integrals over shapes i and j.

multiply componentwise: $u \leftarrow A_s s$

That is, u is an array of vectors. The x-components of u are obtained by multiplying the x-components of s by $A_s$, etc.

for each basis function i let j be the index of the shape for basis function i let $\rho_c$ be basis function i evaluated at shape j's centroid $x_i \leftarrow \rho_c \cdot u_j$ return $V^T x$.

The invention claimed is:

1. A method executed in a computer for analyzing a given integrated circuit layout design by receiving from a CAD tool said integrated circuit layout design, subdividing the layout into mesh elements, developing at least one matrix that describes effects of electromagnetic fields at each of the mesh elements due to electromagnetic currents or charges, at each of the others of the mesh elements, and computing currents or charges at various points of said circuit in response to predetermined input electromagnetic fields by employing said at least one matrix, the improvement characterized by:

said step of subdividing employing a method that is sensitive to said layout and which focuses on creating a plurality of mesh element of different geometric types with translational congruencies to other mesh elements of like types.

2. The method of claim 1 where said step of subdividing employs a method that focuses on maximizing number of mesh elements with translational congruencies to other mesh elements.

3. The method of claim 1 where said step of dividing employs shapes from a set of preselected shapes, and a method for subdividing an IC layout is used with a focus toward increasing instances where Translation and Rotation (T-R) congruence exists between different pairs of mesh elements.

4. The method of claim 3 where said set includes three-dimensional and two-dimensional shapes.

5. A method executed in a computer for analyzing an integrated circuit design, comprising the steps of:

Receiving, via a CAD tool, a description of the circuit, subdividing the circuit into a plurality of conducting volumes and surfaces (mesh elements) $x_k$ k=1, 2, . . . N;

developing at least one matrix that describes electromagnetic field effects at each of the mesh elements due to average electromagnetic currents or charges, or both currents and charges, at each of the others of the mesh elements; and computing currents or charges at various points of said circuit in response to predetermined input electromagnetic fields by employing the at least one matrix;

where each of said mesh elements is represented by a tuple that includes an element type parameter, a position offset parameter, and a rotation parameter.

6. The method of claim 5 where the at least one matrix is a first matrix that describes resistive effects, a second matrix that describes inductive effects, and a third matrix that describes capacitive effects.

7. The method of claim 6 where said computing is a function of the type parameter of the affected element, type parameter of the affecting element, the relative position offset, and the relative rotation.

8. The method of claim 7 where said computing is dispensed with when the type parameter of the affected element, type parameter of the affecting element, the relative position offset and the relative rotation, for a given pair of affected and affecting elements ($x_a$, $x_b$, respectively) are the same as for a previously computed pair of affected elements and affecting elements ($x_c$, $x_d$), employing previously computed electromagnetic field value $F_{c,d}$, which is the value of elements $x_d$ on element $x_c$, for needed electromagnetic field value for elements $F_{a,b}$, which is the value of element $x_b$, on element $x_a$.

9. The method of claim 8 where the computed electromagnetic field values are stored in a compressed form.

10. The method of claim 6 where said step of dividing specifies each of said mesh elements in terms of the mesh element's translation and rotation congruence with another mesh element having the same shape.

* * * * *